(12) United States Patent
Hayashi et al.

(10) Patent No.: US 10,404,288 B2
(45) Date of Patent: Sep. 3, 2019

(54) PACKET DECODING DEVICE, PACKET DECODING METHOD, AND STORAGE MEDIUM IN WHICH PROGRAM IS STORED

(71) Applicant: NEC CORPORATION, Tokyo (JP)

(72) Inventors: Yuki Hayashi, Tokyo (JP); Jun Suzuki, Tokyo (JP); Masaki Kan, Tokyo (JP)

(73) Assignee: NEC CORPORATION, Minato-Ku, Tokyo (JP)

( * ) Notice: Subject to any disclaimer, the term of this patent is extended or adjusted under 35 U.S.C. 154(b) by 62 days.

(21) Appl. No.: 15/312,808

(22) PCT Filed: May 19, 2015

(86) PCT No.: PCT/JP2015/002518
§ 371 (c)(1),
(2) Date: Nov. 21, 2016

(87) PCT Pub. No.: WO2015/178018
PCT Pub. Date: Nov. 26, 2015

(65) Prior Publication Data
US 2017/0155408 A1     Jun. 1, 2017

(30) Foreign Application Priority Data
May 22, 2014    (JP) ................ 2014-105826

(51) Int. Cl.
*H03M 13/37* (2006.01)
*H03M 13/00* (2006.01)
*H04L 1/00* (2006.01)

(52) U.S. Cl.
CPC ......... *H03M 13/37* (2013.01); *H03M 13/373* (2013.01); *H03M 13/3761* (2013.01); *H03M 13/616* (2013.01); *H04L 1/0041* (2013.01); *H04L 1/0045* (2013.01); *H04L 1/0058* (2013.01)

(58) Field of Classification Search
CPC ...... H03M 13/05; H03M 13/19; H03M 13/37; H03M 13/3761; H03M 13/47;
(Continued)

(56) References Cited

U.S. PATENT DOCUMENTS

2001/0029441 A1\* 10/2001 Hachiya ................. G06F 17/12
                                                                        703/2
2009/0292966 A1    11/2009 Liva et al.
(Continued)

FOREIGN PATENT DOCUMENTS

JP       2001290796 A    10/2001
JP       2006512790 A     4/2006
(Continued)

OTHER PUBLICATIONS

Mackay, D.J.C., "Fountain codes", IEE Proc.-Commun., Dec. 2005, pp. 1062-1068, vol. 152, No. 6.
(Continued)

*Primary Examiner* — Guy J Lamarre
(74) *Attorney, Agent, or Firm* — Sughrue Mion, PLLC

(57) ABSTRACT

To speed up processing for decoding a source packet from a coded packet based on rateless coding, a terminal is provided with: a storage unit which holds a matrix with n rows and n columns and an n-bit flag; and a calculation unit which performs processing for extracting an element that becomes 1 in both a received n-bit coded packet and the flag, and performing processing for performing an exclusive OR operation of a row vector of the matrix that corresponds to the element number of the extracted element and the received coded packet on all extracted elements, determines an element that is the first to become 1 in the coded packet after the exclusive OR operation, and inserts, into the matrix,
(Continued)

the coded packet after the exclusive OR operation as a row vector corresponding to the element number of the determined element.

7 Claims, 12 Drawing Sheets

(58) Field of Classification Search
CPC .............. H03M 13/616; H03M 13/63; H03M 13/6306; H04L 1/0041; H04L 1/0045; H04L 1/0058; H04L 1/12; H04L 1/16; H04L 1/18; H04L 1/1819; G06F 11/08
See application file for complete search history.

(56) References Cited

U.S. PATENT DOCUMENTS

2013/0151932 A1    6/2013  Matuz et al.
2014/0289590 A1*   9/2014  Fang ................. H03M 13/2909
                                                                 714/776

FOREIGN PATENT DOCUMENTS

JP    2011-041076 A    2/2011
JP    2012-142709 A    7/2012

OTHER PUBLICATIONS

Yuki Hayashi et al., "Delay Guarantee Method using Rateless Code for High Lossy Networks", IEICE Technical Report, Nov. 7, 2013, pp. 91-96, vol. 113, No. 292, NS2013-132.

Toshio Endo et al., "Highly Latency Tolerant Gaussian Elimination", IPSJ SIG Notes, Aug. 5, 2005, pp. 121-126, vol. 2005, No. 81.

International Search Report of PCT/JP2015/002518 dated Aug. 4, 2015 [PCT/ISA/210].

Written Opinion of PCT/JP2015/002518 dated Aug. 4, 2015 [PCT/ISA/237].

Communication dated Dec. 25, 2018 from the Japanese Patent Office in application No. 2016-520938.

* cited by examiner

Fig. 5
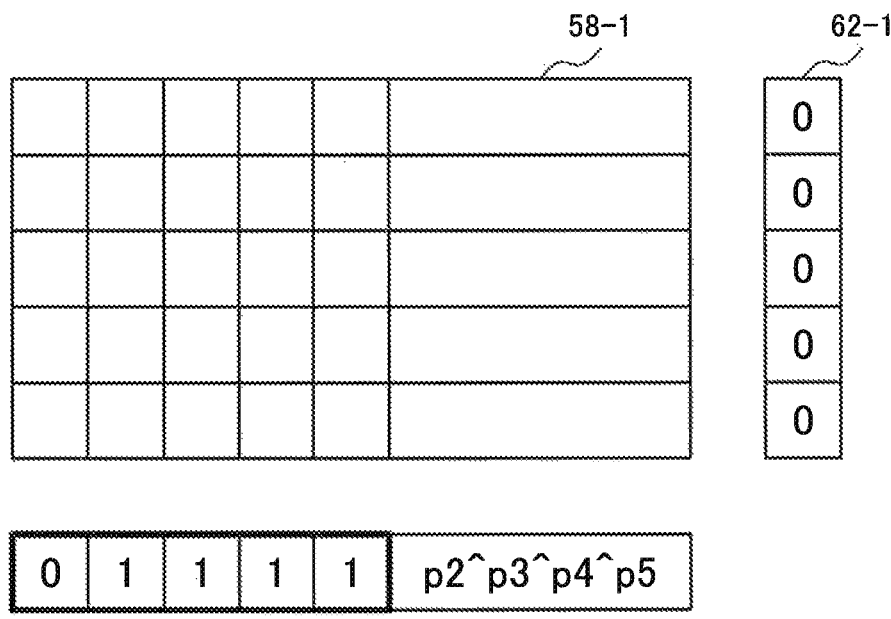
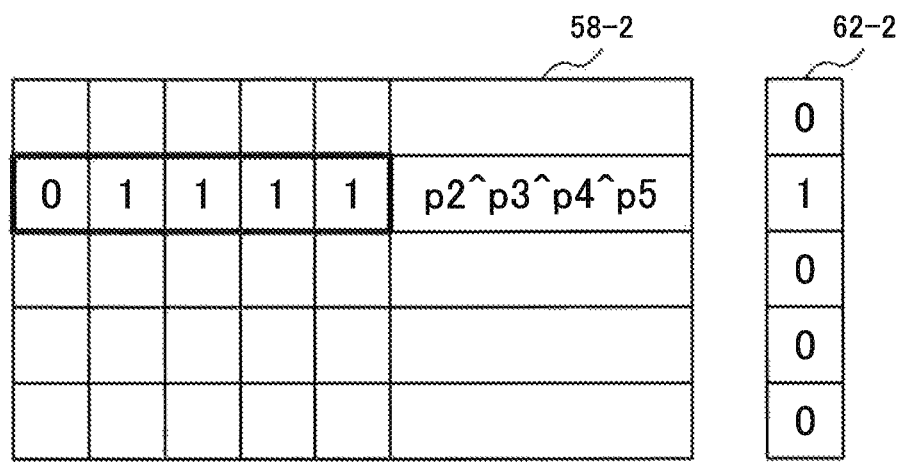

Fig. 6

|   |   |   |   |   |                  |
|---|---|---|---|---|------------------|
|   |   |   |   |   |                  |
| 0 | 1 | 1 | 1 | 1 | p2^p3^p4^p5 |
|   |   |   |   |   |                  |
|   |   |   |   |   |                  |
|   |   |   |   |   |                  |

58-3

| 0 |
|---|
| 1 |
| 0 |
| 0 |
| 0 |

62-3

| 0 | 1 | 0 | 0 | 1 | p2^p5 |

|   |   |   |   |   |                  |
|---|---|---|---|---|------------------|
|   |   |   |   |   |                  |
| 0 | 1 | 1 | 1 | 1 | p2^p3^p4^p5 |
| 0 | 0 | 1 | 1 | 0 | p3^p4          |
|   |   |   |   |   |                  |
|   |   |   |   |   |                  |

58-4

| 0 |
|---|
| 1 |
| 1 |
| 0 |
| 0 |

62-4

|   |   |   |   |   |                  |
|---|---|---|---|---|------------------|
|   |   |   |   |   |                  |
| 0 | 1 | 0 | 0 | 1 | p2^p5          |
| 0 | 0 | 1 | 1 | 0 | p3^p4          |
|   |   |   |   |   |                  |
|   |   |   |   |   |                  |

58-5

| 0 |
|---|
| 1 |
| 1 |
| 0 |
| 0 |

62-5

Fig. 7
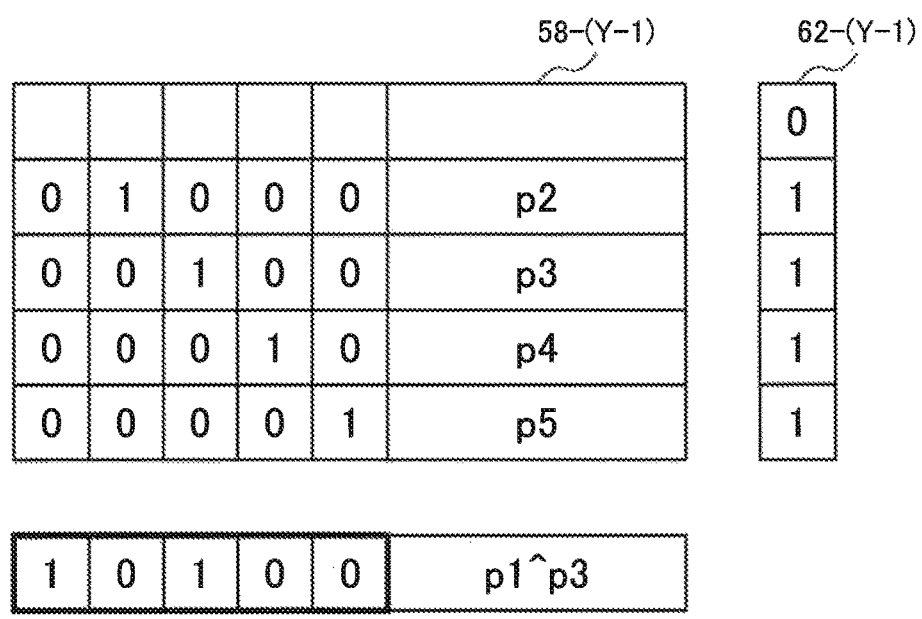
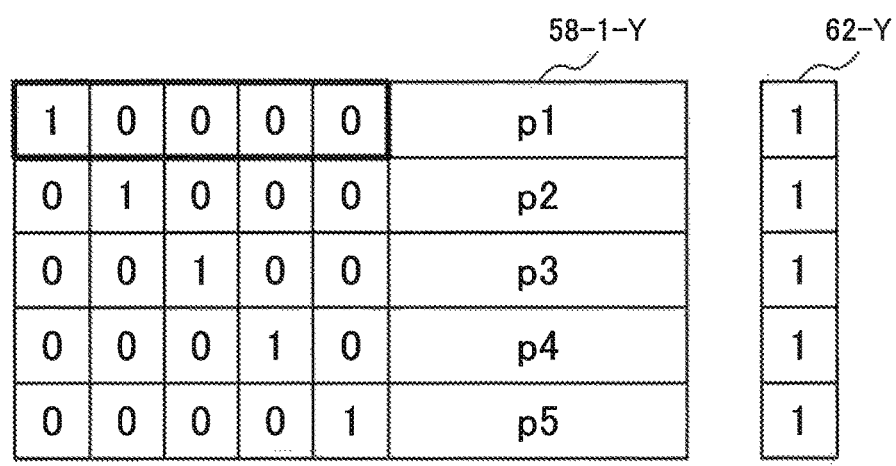

| 0 | 1 | 1 | 1 | 1 | p2^p3^p4^p5 |
| 0 | 1 | 0 | 0 | 1 | p2^p5 |
| 0 | 0 | 0 | 1 | 1 | p4^p5 |
| 0 | 0 | 0 | 0 | 1 | p5 |
| 1 | 0 | 1 | 0 | 0 | p1^p3 |

34-2

| 1 | 0 | 1 | 0 | 0 | p1^p3 |
| 0 | 1 | 0 | 0 | 1 | p2^p5 |
| 0 | 0 | 0 | 1 | 1 | p4^p5 |
| 0 | 0 | 0 | 0 | 1 | p5 |
| 0 | 1 | 1 | 1 | 1 | p2^p3^p4^p5 | i = 1

⋮

34-X

| 1 | 0 | 0 | 0 | 0 | p1 |
| 0 | 1 | 0 | 0 | 0 | p2 |
| 0 | 0 | 1 | 0 | 0 | p3 |
| 0 | 0 | 0 | 1 | 0 | p4 |
| 0 | 0 | 0 | 0 | 1 | p5 | i = 5

PACKET DECODING DEVICE, PACKET DECODING METHOD, AND STORAGE MEDIUM IN WHICH PROGRAM IS STORED

CROSS REFERENCE TO RELATED APPLICATIONS

This application is a National Stage of International Application No. PCT/JP2015/002518, filed May 19, 2015, claiming priority based on Japanese Patent Application No. 2014-105826, filed May 22, 2014, the contents of all of which are incorporated herein by reference in their entirety.

TECHNICAL FIELD

The present invention relates to a terminal, a packet decoding method and a recording medium storing a program, and in particular to a terminal which receives encoded packets sequentially from a terminal on a sending side and decodes them, a packet decoding method of the terminal and a recording medium storing a program to operate in the terminal.

BACKGROUND ART

The FEC (Forward Error Correction) is known as a method for recovering an original packet in case of occurrence of packet loss in a transmission line. In the FEC method, in a transmission line with a packet loss possibility, a sending terminal sends a source packet with an encoded packet added to it, to a network. When there is a packet not received by a reception terminal, the reception terminal recovers the lost packet on the basis of a corresponding encoded packet.

There is one class of the FEC method called "rateless codes" (also called "fountain codes") in which redundant packets are generated limitlessly from source packets, and the source packets are decoded from the redundant packets at a reception terminal.

There is known a method, included in the rateless codes, which, when an unidentified source packet exists at a time of decoding, calculates a matrix generated from encoded packets on the basis of Gaussian elimination, thereby decoding the source packet from the encoded packets (Non-patent Literature 1 (NPL 1), Patent Literature 1 (PTL 1)).

FIG. 8 is a block diagram showing an example of a configuration of a communication system (encoded packet transmission/reception system) comprising terminals according to the related art. Referring to FIG. 8, a sending terminal 10 and a reception terminal 20 are connected with each other via a network 30. The sending terminal 10 comprises a source packet sending unit 12, a packet encoding unit 14 and a packet sending unit 16. On the other hand, the reception terminal 20 comprises a packet reception unit 22, a packet decoding unit 24 and a source packet reception unit 26.

FIG. 9 is a block diagram showing an example of a configuration of the packet decoding unit 24 in the reception terminal 20 of FIG. 8. Referring to FIG. 9, the packet decoding unit 24 comprises a packet decoding calculation section 28 and a decoding determination section 36. Further, the packet decoding calculation section 28 comprises a Gaussian elimination part 32 and stores a decoding matrix 34.

The communication system according to the related art having the above-described configuration operates as follows. FIG. 10 shows an example of a state where the packet coding unit 14 of the sending terminal 10 encodes packets and a state where the packet decoding section 24 of the reception terminal 20 decodes the encoded packets.

First, operation of the sending terminal 10 will be described. The source packet sending unit 12 sends generated N number of source packets 38 to the packet coding unit 14. The packet coding unit 14 selects packets at random from among the received N number of source packets 38, and generates a packet obtained by exclusive OR (XOR) operation on the selected packets as one of encoded packets 42. The packet coding unit 14 adds arrays each indicating source packets used in generating the corresponding one of the encoded packets 42 (a random matrix G illustrated in FIG. 10), to the encoded packets 42. Further, the packet coding unit 14 sends thus generated encoded packets 42 to the packet sending unit 16. The packet sending unit 16 sends the encoded packets 42 it thus received to the network 30. Accordingly, in FIG. 10, packets consisting of respective rows of the random matrix G and respective rows of the encoded packets 42 are sent by the packet sending unit 16. Specifically, in the example shown in FIG. 10, the random matrix G is that of six rows by five columns. There, based on the five source packets 38 (N=5), for example, a 6-bit packet denoted as [0, 1, 1, 1, 1, p2^p3^p4^ p5 (denoting a result of XOR operation on p2, p3, p4 and p5, which is, for example, 1)] which is obtained by adding the first row of the random matrix G to the first row of the encoded packets 42. Similarly, for example, packets consisting of respective ones of the second to sixth rows of the random matrix G and those of the encoded packets 42 are sent. Accordingly, the source packets 38 are sent in the form of six 6-bit packets.

Next, operation of the reception terminal 20 will be described. The packet reception unit 22 sends encoded packets 44 it received via the network 30 to the packet decoding unit 24. The packet decoding unit 24 performs decoding operation each time receiving a packet, thereby trying to decode the encoded packets 44 into N number of source packets 46. As shown in FIG. 10, the packet decoding unit 24 uses, for example, a general decoding method which constructs arrays representing source packets and uses Gaussian elimination. When having succeeded in decoding the received encoded packets 44 into the N number of source packets 46, the packet decoding unit 24 sends the N number of source packets 46 to the source packet reception unit 26. In the example shown in FIG. 10, packet loss occurs to the fourth one of the six packets sent by the packet sending unit 16, and accordingly, five packets are received by the packet reception unit 22, where the number of received packets, 5, is a number not less than the number of the source packets 38. Therefore, from the received five packets, five simultaneous linear equations can be generated, where the number of linear equations, 5, is a number not less than the number of the source packets 38. Accordingly, based on the five simultaneous linear equations, the five source packets 38 can be derived by Gaussian elimination.

Here, a description will be given of Gaussian elimination, which is a general decoding method. FIG. 11 is a flow diagram showing an algorithm of decoding (Gaussian elimination) in the reception terminal 20 of the related art. Here, to simplify the present description, in FIG. 12, a matrix calculation process (i=1) is shown with respect to a case where the number of source packets, N, is 5, as an example of operation in each phase.

With reference to FIGS. 11 and 12, descriptions will be given of a general Gaussian elimination algorithm and of the matrix calculation process (i=1) with respect to a case where the number of source packets, N, is 5, as an example of description of the algorithm.

First, in a step A2, a row vector with its i-th element being 1 is selected from among the row vectors below the i-th row. At that time, if no such row vector to select is found (NO at a step A3), the calculation of Gaussian elimination is ended. In the case of the example of operation in FIG. 12, in a decoding matrix 34-1, a row vector with its first element being 1 among the row vectors below the i-th row is the fifth one, and accordingly, the fifth row vector is selected.

Then, in a step A4, the selected row vector is exchanged with the row vector of the first row. The i-th element of a row vector of the i-th row after the exchange is referred to as a "pivot", and the row vector itself as a "pivot row". In the case of the example of operation in FIG. 12 (i=1), the Gaussian elimination part 32 exchanges the row vector of the fifth row with that of the first row, in the decoding matrix 34-1. A decoding matrix 34-2 is the decoding matrix in the state after thus exchanging the row vectors.

Next, in a step A5, the Gaussian elimination part 32 performs XOR operation between the pivot row and a row vector with its i-th element being 1 other than the pivot row. In the case of the example of operation in FIG. 12 (i=1), there is no other row vector with its first element being 1 than the pivot row, in the decoding matrix 34-2, and accordingly, the Gaussian elimination part 32 performs no such XOR operation.

The Gaussian elimination part 32 performs the above-described operation for i=2 to 5 repeatedly, as described in steps A1 and A7. As shown in FIG. 12, when the calculation has been performed with respect to the rows down to the fifth row, a decoding matrix 34-X resulting from the application of Gaussian elimination becomes an identity matrix, where the encoded packets have been decoded.

Further, it may occur that, when the above-described operation has been completed for i=5, the sending terminal 10 sends the next group of source packets after encoding them. In that case, the steps for i=1 to 5 are repeated again several times.

In the case of the communication system according to the related art, the decoding by Gaussian elimination is performed each time receiving a packet. However, when the decoding method is used, it is possible that there occurs variance in the calculation amount among packet receptions or that the calculation amount after receiving the N-th encoded packet becomes large, and consequently that the calculation cannot be completed before the arrival of encoded packets with respect to the next source packets or some other problem occurs.

For example, in the case of the decoding matrix 34-1 in FIG. 12, the Gaussian elimination part 32 cannot apply Gaussian elimination in the step A3 until the encoded packet corresponding to the fifth row vector arrives, and accordingly cannot advance the calculation. That is, the calculation by the Gaussian elimination part 32 is started only after the arrival of the packet corresponding to the fifth row vector, which causes the Gaussian elimination part 32 to perform each of the process of the step A4 and that of the step A5 five times after the arrival of the packet corresponding to the fifth row vector.

As a result, at a time of their arrival, encoded packets with respect to the next group of source packets are required to wait until the calculation on the encoded packets with respect to the present group of source packets is completed.

As a method for increasing the speed of such calculation by Gaussian elimination in a communication system in which encoded packets are sent and received in the above-described manner, there is a method described in PTL 1, for example.

CITATION LIST

Patent Literature

[PTL 1] Japanese Laid-Open Patent Application No. 2012-142709

Non-Patent Literature

[NPL 1] MacKay, D. J. C., "Fountain codes," Published in Communications, IEE Proceedings (Volume: 152, Issue: 6)

SUMMARY OF INVENTION

Technical Problem

It is assumed that the whole disclosures of PTL 1 and NPL 1 mentioned above are incorporated herein by reference. The following analysis is made by the inventors of the present application.

According to the above-mentioned related art for decoding encoded packets based on rateless coding, there is a problem in that, when the encoded packets are decoded at a reception terminal each time it receives a packet, it takes a long time from reception of the final packet to completion of the decoding. It is because the decoding method using Gaussian elimination searches for a pivot row in ascending order in terms of the source packets and, if no pivot row is found by the ascending order, ends the calculation.

Further, it is necessary to dispose a large number of buffers in the reception terminal receiving encoded packets, in the related art, in order to prepare for a case where, when the operation is performed by separating a plurality of groups of source packets into a plurality of groups of encoded packets, an encoded packet with respect to the next group of source packets arrives before completing decoding of encoded packets with respect to the present group of source packets. It is because of the necessity of a long time from reception of the final one of a group of packets to completion of the decoding of the packets.

It should be noted that the method described in PTL 1 removes a packet having been decoded as a source packet, from the decoding matrix, thereby reducing the calculation amount after that. Therefore, by the method described in PTL 1, the reduction of the calculation amount cannot be achieved unless calculation of Gaussian elimination is started.

Accordingly, increasing the speed of a process of decoding source packets from encoded packets based on rateless coding is recognized as a problem to solve. The objective of the present invention is to provide a terminal, a packet decoding method and a recording medium storing a program which contribute to solution of the problem.

Solution to Problem

A terminal according to the first aspect of the present invention comprises:

a storage means for holding a matrix of n number of rows by n number of columns and an n-bit flag; and a calculation means for extracting corresponding elements in a received n-bit encoded packet and in the flag both having a value of 1, performing, with respect to each element number of the corresponding elements thus extracted, exclusive OR operation between a row vector of the matrix corresponding to the element number and the received encoded packet, determining an element that is a first one of elements having a value of 1 in the encoded packet after the exclusive OR operation, and inserting the encoded packet after the exclusive OR operation into the matrix as a row vector corresponding to an element number of the element thus determined.

A packet decoding method performed by a computer according to the second aspect of the present invention comprises:

holding a matrix of n number of rows by n number of columns and an n-bit flag in a storage means;

extracting corresponding elements in a received n-bit encoded packet and in the flag both having a value of 1;

performing, with respect to each element number of the corresponding elements thus extracted, exclusive OR operation between a row vector of the matrix corresponding to the element number and the received encoded packet;

determining an element that is a first one of elements having a value of 1 in the encoded packet after the exclusive OR operation; and inserting the encoded packet after the exclusive OR operation into the matrix as a row vector corresponding to the element number of the element thus determined.

A recording medium storing a program according to the third aspect of the present invention stores a program for causing a computer to execute:

a process of holding a matrix of n number of rows by n number of columns and an n-bit flag in a storage means;

a process of extracting corresponding elements in a received n-bit encoded packet and in the flag both having a value of 1;

a process of performing, with respect to each element number of the corresponding elements thus extracted, exclusive OR operation between a row vector of the matrix corresponding to the element number and the received encoded packet;

a process of determining an element that is a first one of elements having a value of 1 in the encoded packet after the exclusive OR operation; and a process of inserting the encoded packet after the exclusive OR operation into the matrix as a row vector corresponding to an element number of the element thus determined. It should be noted that the program is provided as a program product which is a non-transitory computer-readable storage medium storing the program.

Advantageous Effects of Invention

A terminal, a packet decoding method and a recording medium storing a program according to the present invention make it possible to increase the speed of a process of decoding source packets from encoded packets based on rateless coding.

BRIEF DESCRIPTION OF DRAWINGS

FIG. 5 is a diagram showing an example of a process of calculating a decoding matrix and a pivot flag (i=1) by the packet decoding calculation section in the terminal according to the first exemplary embodiment.

FIG. 6 is a diagram showing an example of a process of calculating a decoding matrix and a pivot flag (i=2) by the packet decoding calculation section in the terminal according to the first exemplary embodiment.

FIG. 7 is a diagram showing an example of a process of calculating a decoding matrix and a pivot flag (i=5) by the packet decoding calculation section in the terminal according to the first exemplary embodiment.

FIG. 12 is a diagram showing an example of a process of calculating a decoding matrix (when N=5) by the packet decoding calculation section in the terminal of related art.

DESCRIPTION OF EMBODIMENTS

First, an outline of an exemplary embodiment of the present invention will be described. Here, a drawing associated with the present outline, as well as reference signs assigned therein, is only an example for helping to understand the outline, and is not intended to limit the present invention to an aspect illustrated there.

Figure 1:
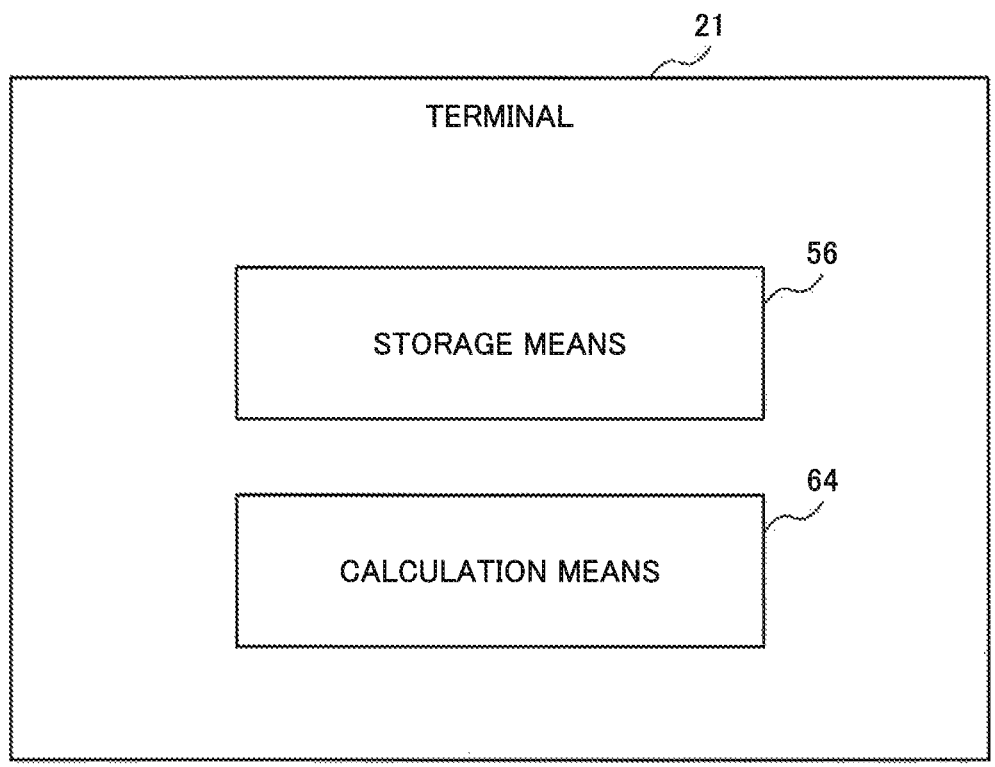
FIG. 1 is a block diagram showing an example of a configuration of a terminal according to an exemplary embodiment.

FIG. 1 is a block diagram showing an example of a configuration of a terminal 21 of the present exemplary embodiment. Referring to FIG. 1, the terminal 21 comprises a storage means 56 and a calculation means 64. The storage means 56 holds a matrix of n number of rows by n number of columns (for example, a decoding matrix 58 shown in FIGS. 5 to 7, when n=5) and a flag consisting of n number of bits (for example, a pivot flag 62 shown in FIGS. 5 to 7, when n=5). The calculation means 64 extracts an element number whose corresponding element in a just-received n-bit encoded packet and that in the flag (62) both have a value of 1 and, with respect to each and every one of thus extracted element numbers, performs exclusive OR (XOR) operation on the just-received encoded packet with a row vector of the matrix (58) corresponding to the extracted element number. Then, the calculation means 64 determines an element which is the first one among elements having a value of 1 in the encoded packet after XOR operation, and inserts the encoded packet after XOR operation into the matrix (58) as a row vector corresponding to the element number of the determined element.

The calculation means 64 sets a value of 1 for an element of the flag (62) corresponding to the element number of the determined element (here, the scheme is not limited to thus setting the element value to be 1, and any other scheme capable of indicating that a flag is set for the element may be used). It should be noted that if every element of the flag (62) has been set to be 1, it means that the decoding has been completed.

If an element of the flag (62) corresponding to the element having been determined to be the first one of elements having a value of 1 in the encoded packet after XOR operation has already been set to be 1, the calculation means 64 discards the encoded packet after XOR operation instead of inserting it into the matrix (58).

The calculation means 64 performs, on each row vector of the matrix (58) whose element of the same element number as that of the element being the first one of elements having a value of 1 in the encoded packet after XOR operation has a value of 1, a process of replacing the row vector with a result of XOR operation between the row vector and the encoded packet after earlier-described XOR operation.

According to the terminal 21 described above, it becomes possible to increase the speed of the process for decoding source packets from encoded packets based on rateless coding, compared to the related art. It is because, in the present decoding procedure, instead of searching for a pivot row in ascending order in terms of the source packets like in Gaussian elimination in the related art, determination is made each time receiving a packet on what number pivot row the packet is to be, and accordingly, the calculation can be advanced even when the pivot row is determined to be an intermediate one.

First Exemplary Embodiment

Next, a communication system comprising a terminal according to a first exemplary embodiment will be described in detail, with reference to drawings.

Figure 2:
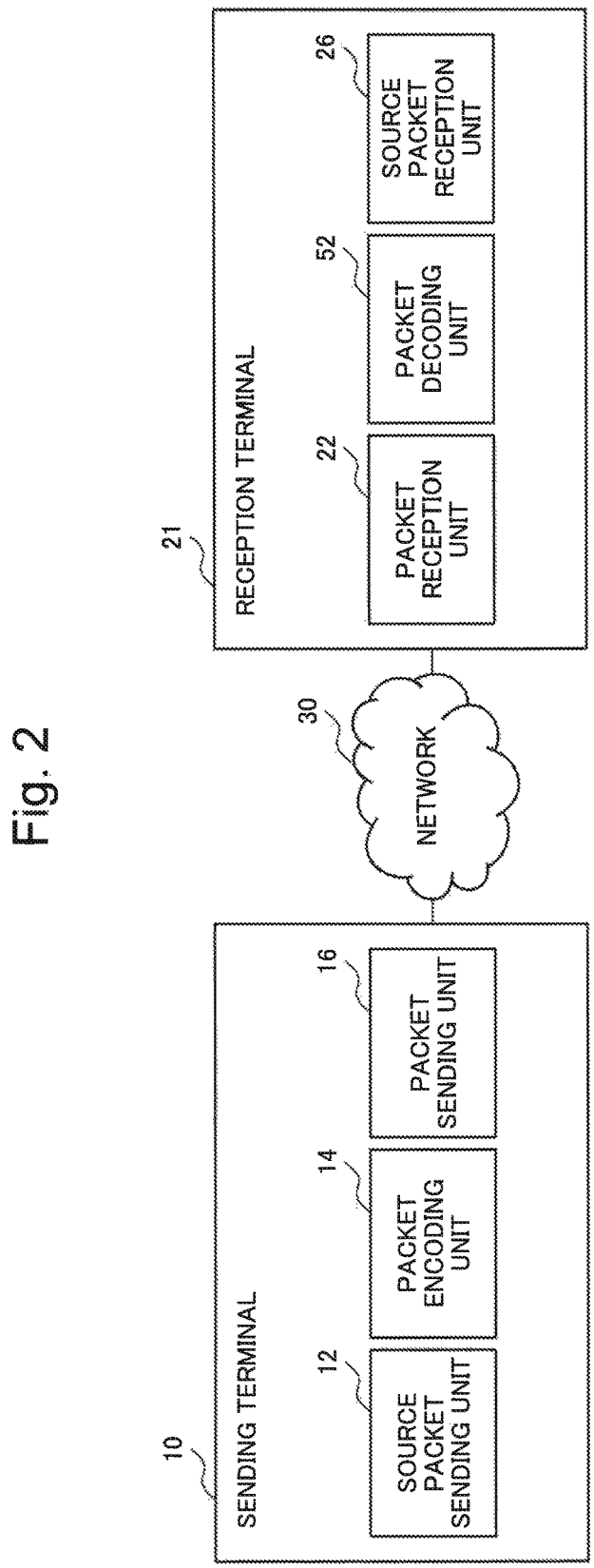
FIG. 2 is a block diagram showing an example of a configuration of a communication system comprising a terminal according to a first exemplary embodiment.

FIG. 2 is a block diagram showing an example of a configuration of the communication system comprising the terminal of the present exemplary embodiment as a reception terminal 21. Referring to FIG. 2, the communication system comprises a sending terminal 10 which encodes source packets and sends the encoded packets into a network, and a reception terminal 21 which decodes encoded packets it has received into source packets.

The sending terminal 10 comprises a source packet sending unit 12, a packet encoding unit 14 and a packet sending unit 16. The source packet sending unit 12 packetizes data which is desired to be sent to the reception terminal 21, in accordance with a protocol of a network to transmit the data. The packet encoding unit 14 encodes source packets to convert them into encoded packets. The packet sending unit 16 sends the encoded packets into a network 30.

On the other hand, the reception terminal 21 comprises a packet reception unit 22, a packet decoding unit 52 and a source packet reception unit 26. The packet reception unit 22 receives the encoded packets arriving from the network 30. The packet decoding unit 52 decodes the encoded packets into the source packets. The source packet reception unit 26 receives the decoded source packets and passes them to the reception terminal 21 as data.

The packet encoding unit 14 performs encoding on N number of source packets (N: an optional natural number) received from the source packet sending unit 12. Here, a description will be given of operation of one method of rateless codes, referred to as Random Linear Fountain, as an encoding method.

In Random Linear Fountain, the packet encoding unit 14 selects packets at random from among the N number of source packets having arrived at it. Then, the packet encoding unit 14 sets a result of calculating exclusive OR (XOR) of the packets it selected, to be an encoded packet. Further, the packet encoding unit 14 adds a flag to the encoded packet so as to make it possible to distinguish which ones of the N number of source packets the source packets it selected are.

For example, in the case of N=5, when the second, third, fourth and fifth source packets were selected, the packet encoding unit 14 adds a 5-bit flag [0, 1, 1, 1, 1] to the encoded packet, thereby making the source packets included in the encoded packet distinguishable. The packet encoding unit 14 repeats the operation limitlessly until the N number of source packets are decoded at the reception terminal 21.

Here, no particular limitation is set on a mechanism by which the sending terminal 10 checks whether or not the N number of source packets have been decoded at the reception terminal 21. For example, the sending terminal 10 may use a method in which it suspends sending of the encoded packets on receiving a decoding completion notification from the reception terminal 21 through feedback information or the like which notifies that the encoding has been completed.

Figure 3:
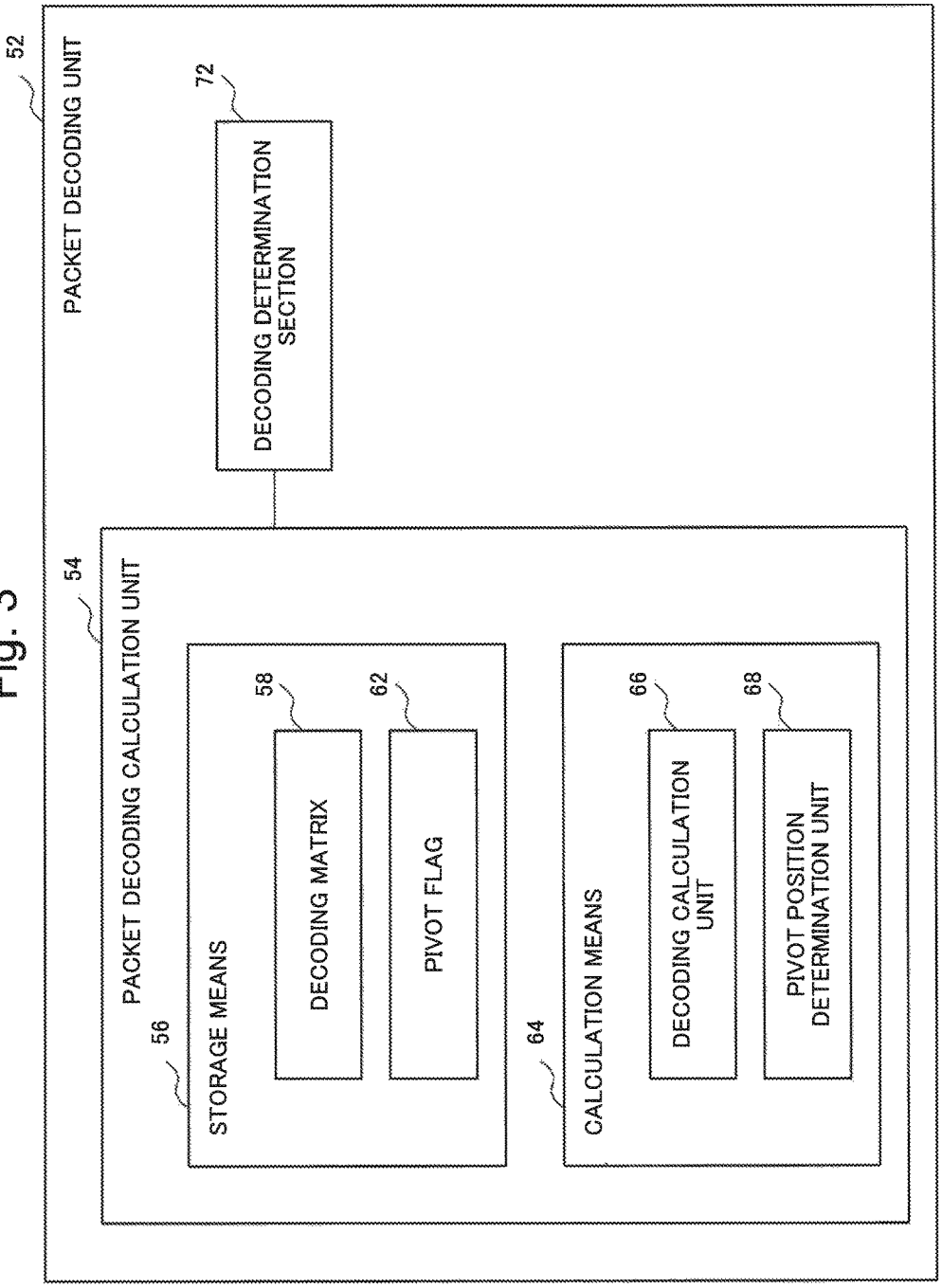
FIG. 3 is a block diagram showing an example of a configuration of a packet decoding unit in the terminal according to the first exemplary embodiment.

FIG. 3 is a block diagram showing an example of a configuration of the packet decoding unit 52 in the reception terminal 21 of the present exemplary embodiment. Referring to FIG. 3, the packet decoding unit 52 comprises a packet decoding calculation section 54 and a decoding determination section 72. The packet decoding calculation section 54 performs calculation for decoding encoded packets received from the packet reception unit 22 into source packets by a decoding algorithm. Referring to the result of the calculation by the packet decoding calculation section 54, the decoding determination section 72 determines whether the encoded packets have been decoded into source packets or still remain undecoded.

The packet decoding calculation section 54 comprises a storage means 56 and a calculation means 64. The storage means 56 holds a decoding matrix 58 and a pivot flag 62. On the other hand, the calculation means 64 comprises a decoding calculation part 66 and a pivot position determination part 68.

The encoded packets received from the packet reception unit 22 are stored as the decoding matrix 58 which has a matrix form. The pivot flag 62 shows whether or not a pivot row in the decoding matrix 58 is already filled with a packet, by a flag. The decoding calculation part 66 performs calculation on the encoded packets received from the packet reception unit 22 and calculation of decoding into source packets based on the decoding matrix 58. Based on the calculation result on the encoded packets received from the packet reception unit 22, the pivot position determination part 68 determines pivot positions of respective ones of the encoded packets after calculation.

The decoding calculation part 66 performs operation to carry out operation between a row vector of the decoding matrix 58 and an encoded packet received from the packet reception unit 22 and, after encoded packet after operation is inserted into the decoding matrix 58 by the pivot position determination part 68, performs operation to carry out operation between the encoded packet after earlier operation and a row vector of the decoding matrix 58.

First, between the above-described operations by the decoding calculation part 66, a description will be given of the operation to carry out operation between a row vector of the decoding matrix 58 and an encoded packet received from the packet reception unit 22. The decoding calculation part 66 compares an encoded packet received from the packet reception unit 22 with the pivot flag 62, thereby finding an element number whose corresponding element in the decoded packet and that in the pivot flag 62 both have a value of 1, and accordingly performs XOR (exclusive OR) operation between the encoded packet and a row vector of the decoding matrix 58 corresponding to the element number. Here, a row vector corresponding to both the i-th element of an encoded packet and that of the pivot flag 62 is referred to as the i-th row vector of the decoding matrix 58.

For example, when the above-described 5-bit flag (also referred to as an encoded packet) added to a received encoded packet is [0, 1, 1, 1, 1] and the pivot flag 62 is [0, 1, 0, 1, 0], the decoding calculation part 66 performs XOR operation between the received encoded packet and each of the second and fourth row vectors of the decoding matrix 58.

Next, between the above-described operations by the decoding calculation part 66, a description will be given of the operation to carry out operation between the encoded packet after XOR operation and a row vector of the decoding matrix 58 after insertion of the encoded packet after XOR operation into the decoding matrix 58 by the pivot position determination part 68. The decoding calculation part 66 checks a column corresponding to the pivot of a pivot row vector inserted as above (that is, the above-described encoded packet after XOR operation), and accordingly performs XOR operation between the pivot row vector and each and every row vector whose element in the column is "1".

The pivot position determination part 68 performs determination of a pivot position, on the encoded packet after completion of the operation by the decoding calculation part 66 to carry out operation between the encoded packet received from the packet reception unit 22 and a row vector of the decoding matrix 58 (that is, the above-described encoded packet after XOR operation). The pivot position represents the first one of elements having a value of "1", among all elements of an encoded packet being a target of the determination (that is, the most significant bit among bits having a value of "1" in a bit string constituting the encoded packet). Subsequently, when the pivot position has been determined to be the X-th element, the pivot position determination part 68 refers to the X-th element of the pivot flag and, if a pivot flag is already set there, regards the encoded packet as unnecessary and discards it. By contrast, if no pivot flag is set there, the pivot position determination part 68 sets the X-th element of the pivot flag to be "1", and inserts the encoded packet after operation into the X-th row of the decoding matrix 58.

After completion of the calculation by the packet decoding calculation section 54, the decoding determination section 72 refers to the decoding matrix 58 and the pivot flag 62, and thereby determines whether the encoded packets have been decoded and N number of source packets accordingly have been generated or not. Specifically, referring to the pivot flag 62, if every one of the N number of elements of the pivot flag 62 has been set to be "1", the decoding determination section 72 determines that the decoding has been completed.

Figure 4:
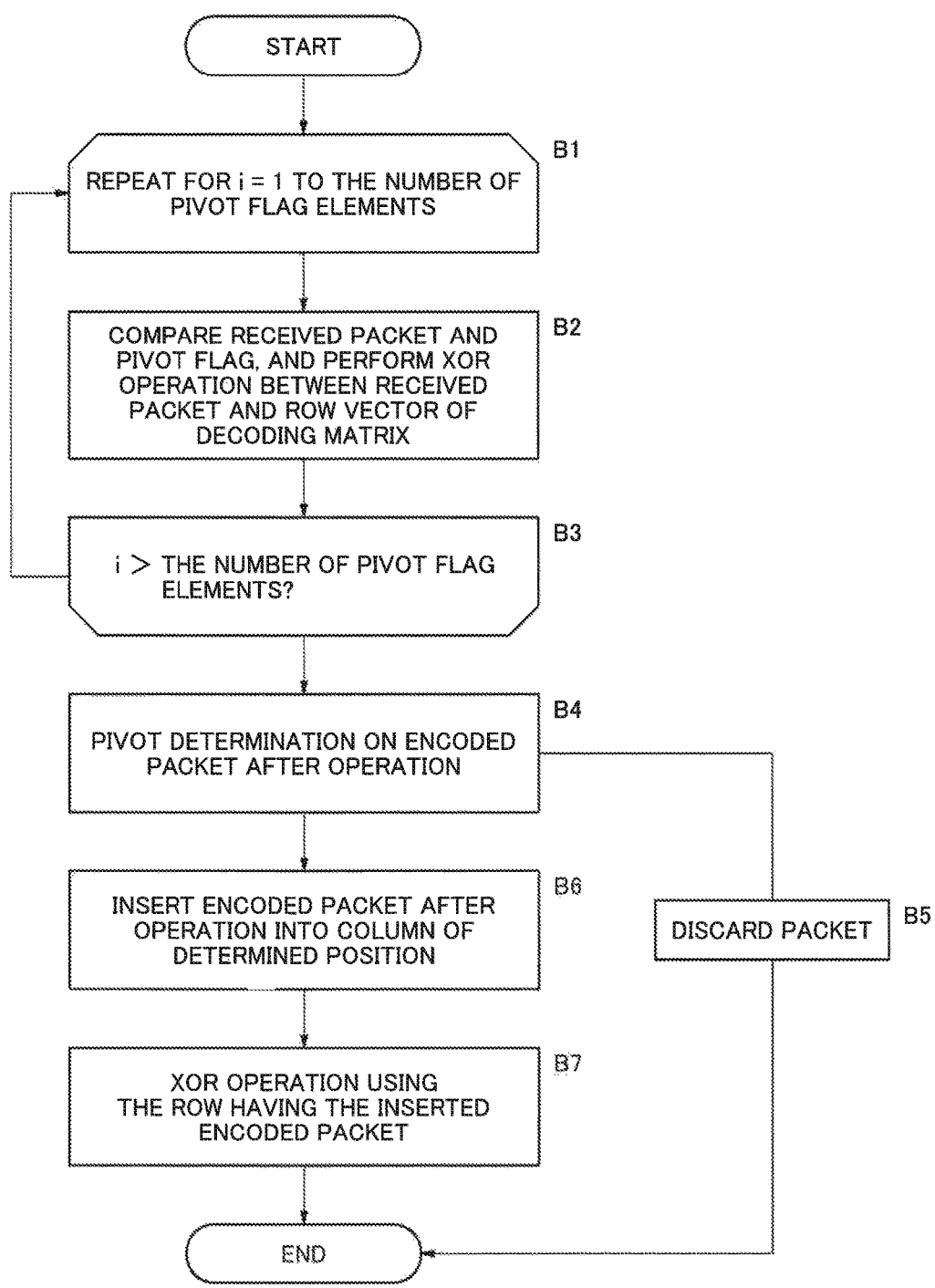
FIG. 4 is a flow diagram showing an example of operation of a packet decoding calculation section in the terminal according to the first exemplary embodiment.
Figure 8:
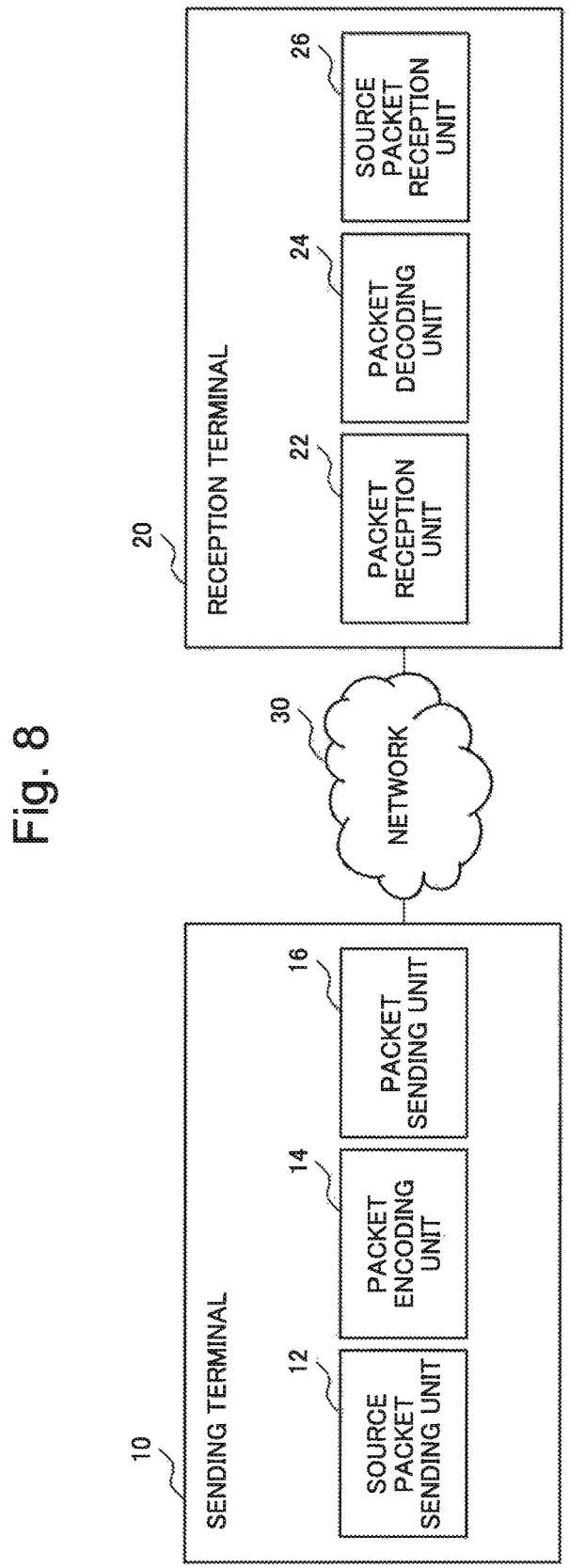
FIG. 8 is a block diagram showing an example of a configuration of a communication system comprising a terminal of related art.
Figure 9:
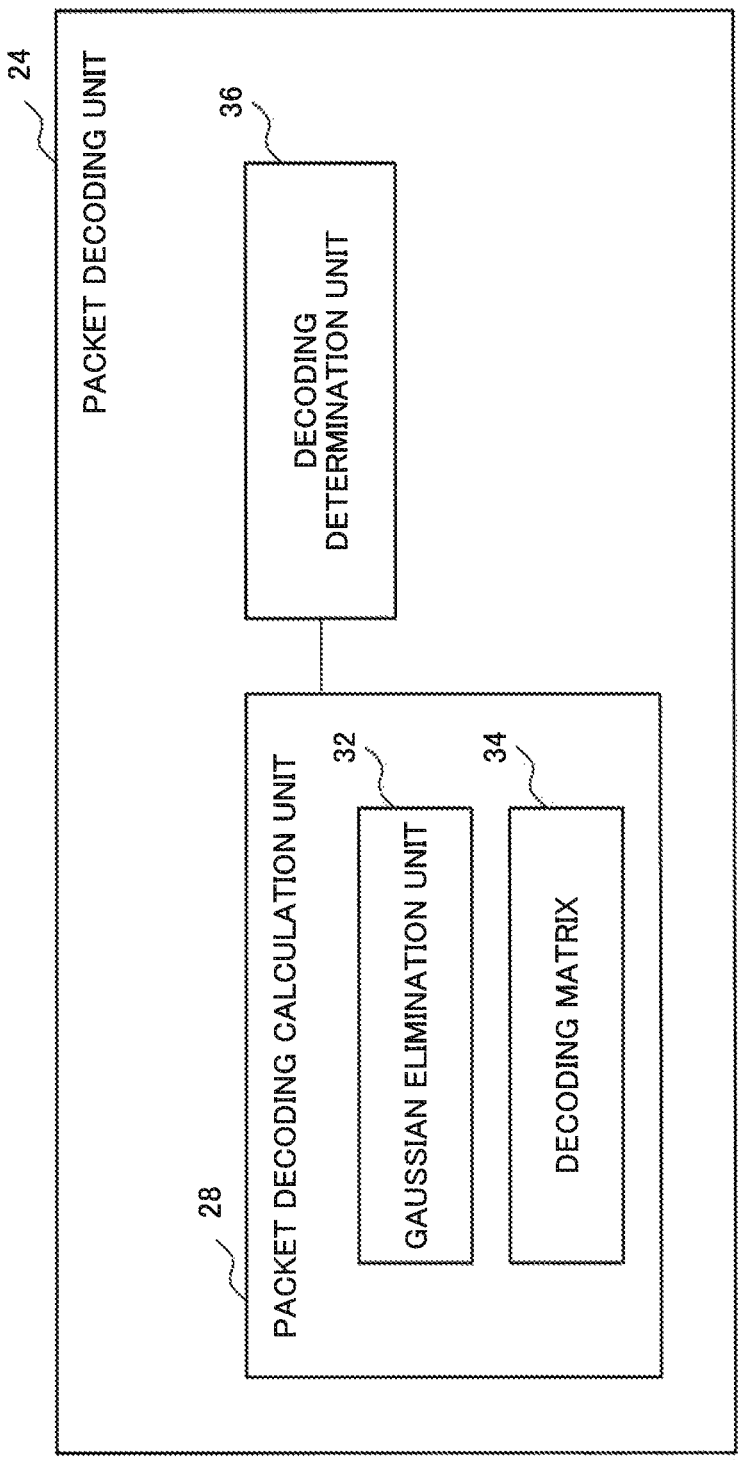
FIG. 9 is a block diagram showing an example of a configuration of a packet decoding unit in the terminal of related art.
Figure 10:
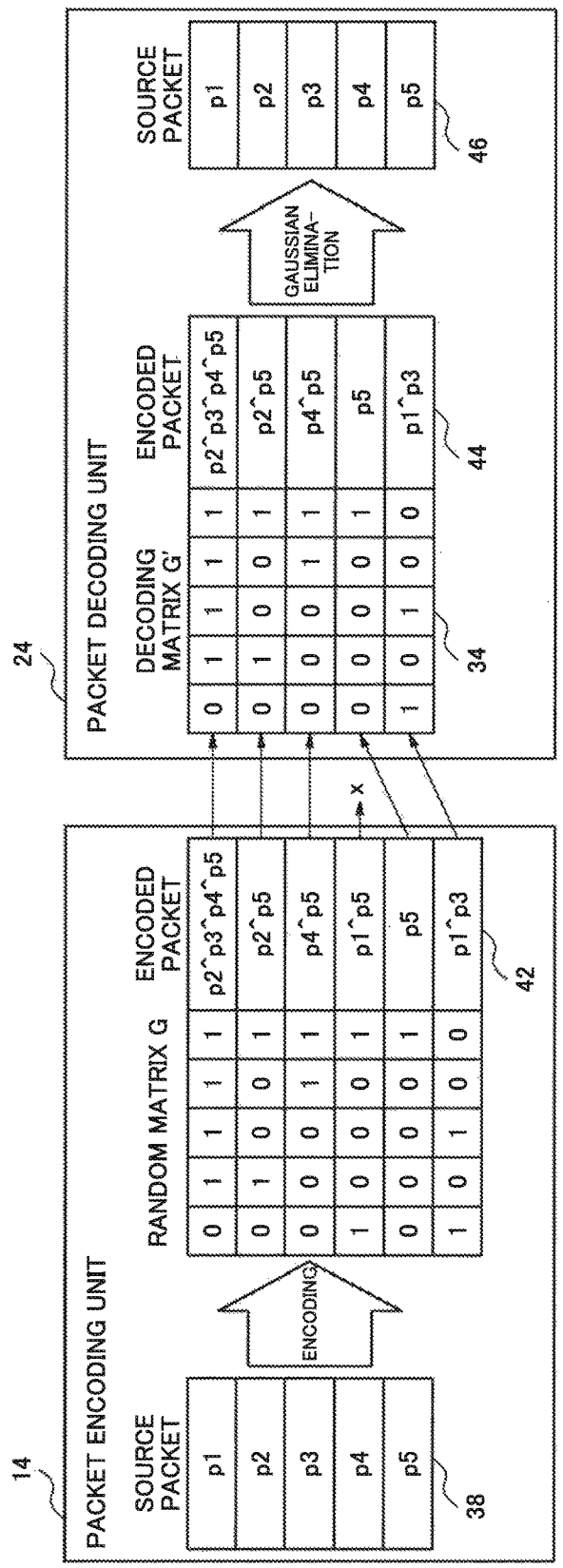
FIG. 10 is a diagram showing an example of operation of packet encoding in the communication system comprising the terminal of related art.
Figure 11:
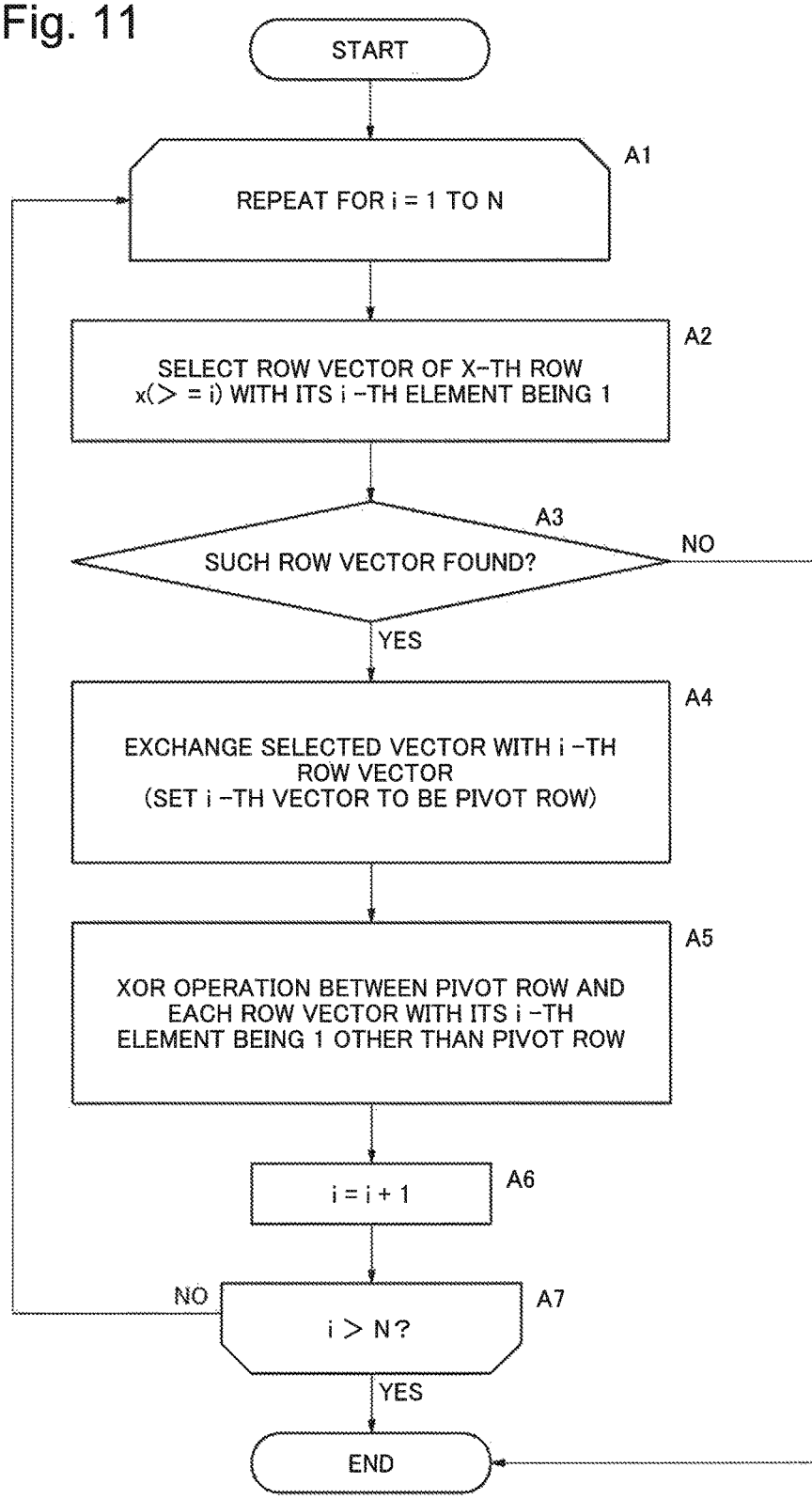
FIG. 11 is a flow diagram showing an algorithm of decoding (Gaussian elimination) in the terminal of related art.

Next, operation of the reception terminal 21 of the present exemplary embodiment will be described in detail, with reference to the block diagrams shown in FIGS. 2 and 3, a flow diagram shown in FIG. 4 and a calculation process of packet decoding in the case of N=5 shown FIGS. 5 to 7.

First, when the packet decoding unit 52 receives an encoded packet from the packet reception unit 22, a transition is made to a step B1.

In a step B2, the decoding calculation part 66 checks the received encoded packet and the pivot flag 62, thereby finding an element number whose corresponding element in the decoded packet and that in the pivot flag 62 both have a value of "1", and accordingly performs XOR operation between the encoded packet and a row vector of the decoding matrix 58 corresponding to the element number. As described in the step B1, the decoding calculation part 66 repeats the comparison and calculation of the step B2 as many times as according to the number of elements having a value of "1" in the pivot flag 62. When the repetition is completed, a transition is made from a step B3 to a step B4.

The present description will be continued below referring to the example of a calculation process of packet decoding shown in FIG. 6, which is for a case of i=2. There, the received encoded packet is [0, 1, 0, 0, 1], and the pivot flag 62-3 is [0, 1, 0, 0, 0]. Accordingly, the decoding calculation part 66 performs XOR operation between the second row vector of the decoding matrix 58-3 and the received encoded packet. As a result, the encoded packet after XOR operation becomes [0, 0, 1, 1, 0].

In the step B4, on the encoded packet after XOR operation, the pivot location determination part 68 performs determination of the pivot position. The pivot position corresponds to the first one of elements having a value of "1" among all elements of the encoded packet after XOR operation (that is, the most significant bit among bits having a value of "1" in a bit string constituting the encoded packet). When the X-th element is the first one having a value of "1" (that is, when it is the most significant bit among bits having a value of "1" in a bit string constituting the encoded packet), the pivot row is determined to be the X-th row. Here, if the X-th element of the pivot flag 62 has already been set to be "1", the pivot position determination part 68 regards the encoded packet as unnecessary and accordingly discards it (step B5), and ends the process. When the encoded packet is not discarded, a transition is made to a step B6.

Figure 6:
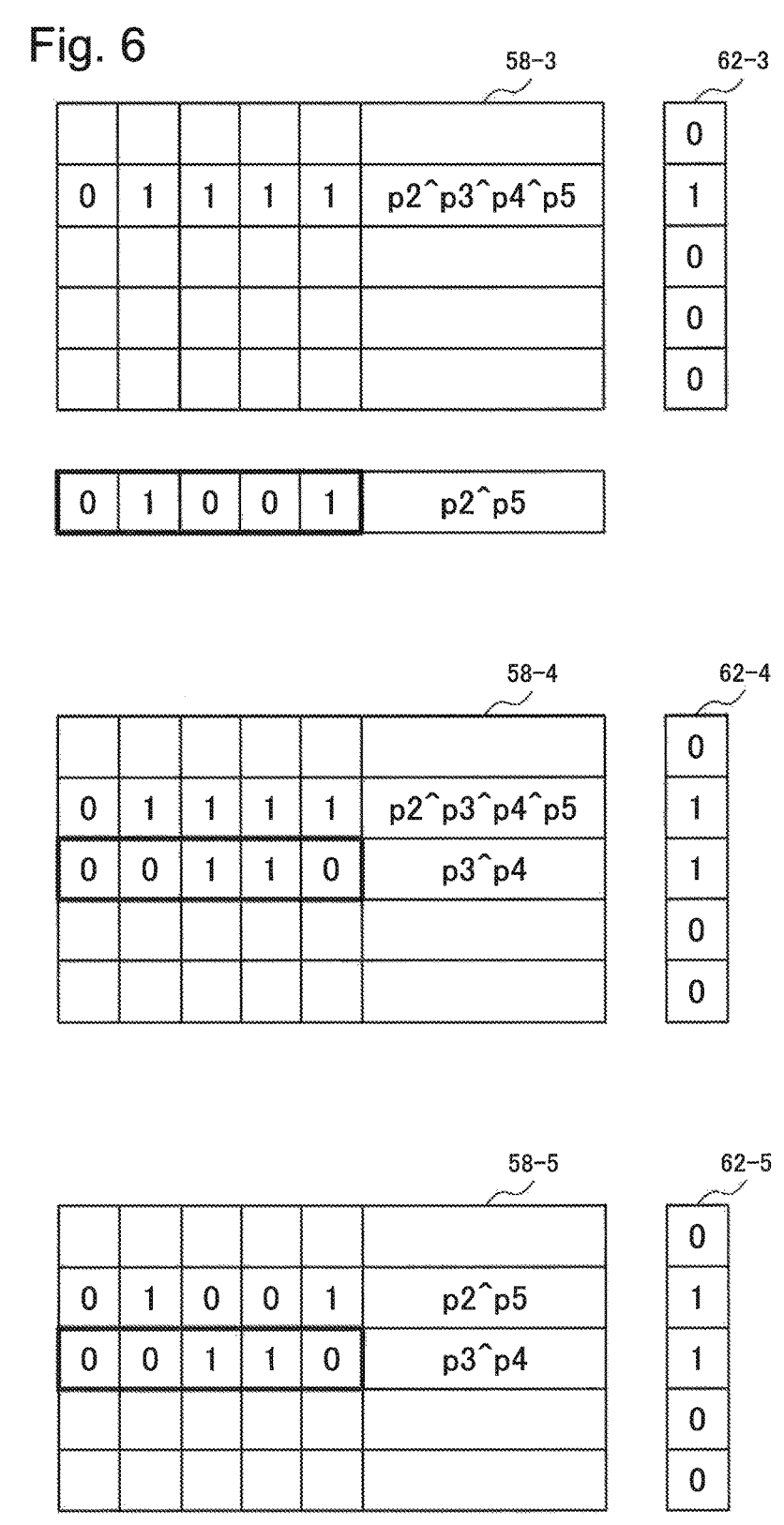

If describing it in terms of the example of FIG. 6, because the encoded packet after XOR operation is [0, 0, 1, 1, 0], the first element having a value of "1" is determined to be the third one (that is, among bits having a value of "1" in a bit string constituting the encoded packet, the most significant bit is the third one), and accordingly, the pivot position determination part 68 determines that the encoded packet is equivalent to a row vector which is to be the third pivot row.

In the step B6, the pivot position determination part 68 performs operation to insert the pivot row determined in the step B4 into the decoding matrix 58 as its X-th row vector. If describing it in terms of the example of FIG. 6, because the encoded packet after calculation is equivalent to a row vector to be the third pivot row, it has been inserted as the third row in the decoding matrix 58-4. When the insertion of the encoded packet has been performed, a transition is made to a step B7.

In the step B7 after the insertion of the encoded packet, the decoding calculation part 66 performs XOR operation between the encoded packet and any other row vector whose element in the same column as that of the element of the encoded packet being the pivot has a value of "1".

If describing it in terms of the example of FIG. 6, because "1" is set for the third column of the second row vector, the second row vector is XOR operated, as a row vector other than the pivot row of the decoding matrix 58-4, with the third row vector (that is, the encoded packet after earlier XOR operation). As a result, as shown in the decoding matrix 58-5, the second row vector becomes [0, 1, 0, 0, 1].

On ending of the step B7, the operation of the packet decoding calculation section 54 is completed, and then the decoding determination section 72 performs determination on the decoding. When every element of the pivot flag 62 has become "1", the decoding determination section 72 regards the decoding as completed.

The above-described operation is repeated until filling up all N number of rows of the decoding matrix 58. If describing it in terms of the example of FIG. 7, when an encoded packet corresponding to i=5 has arrived and subsequent calculation on the encoded packet has been performed, the decoding matrix 58 is wholly filled up and the decoding into source packets is thus completed. At that time, every element of the pivot flag 62-Y has been set to be "1", and accordingly, the decoding determination section 72 determines that the decoding has been completed. After the decoding determination section 72 thus determining that the decoding has been completed, the packet decoding unit 52 sends the source packets to the source packet reception unit 26 and initializes the decoding matrix 58.

Next, advantageous effects of the present exemplary embodiment will be described. According to the terminal 21 of the present exemplary embodiment, it becomes possible to increase the speed of a process for decoding source packets from encoded packets based on rateless coding, compared to the related art. It is because, in the present decoding procedure, instead of searching for a pivot row in ascending order in terms of source packets like in Gaussian elimination used in the related art, determination is made each time receiving a packet on what number pivot row the packet is to become, and accordingly, the calculation can be advanced even when the pivot row is determined to be an intermediate one.

Further, according to the present exemplary embodiment, it is possible to reduce the number of buffers for preparing for a case where an encoded packet with respect to the next group of source packets arrives before completing decoding of encoded packets with respect to the present group of source packets. It is because it takes only a short time to complete decoding of encoded packets after receiving the final one of the encoded packets with respect to a group of source packets.

The whole or part of the exemplary embodiments disclosed above can be described as, but not limited to, the following supplementary notes.

(Supplementary Note 1)

A terminal comprising:

a storage means for holding a matrix of n number of rows by n number of columns and an n-bit flag; and a calculation means for extracting corresponding elements in a received n-bit encoded packet and in the flag both having a value of 1, performing, with respect to each element number of the corresponding elements thus extracted, exclusive OR operation between a row vector of the matrix corresponding to the element number and the received encoded packet, determining an element that is a first one of elements having a value of 1 in the encoded packet after the exclusive OR operation, and inserting the encoded packet after the exclusive OR operation into the matrix as a row vector corresponding to an element number of the element thus determined.

(Supplementary Note 2)

The terminal according to Supplementary note 1, wherein the calculation means sets an element, among elements of the flag, corresponding to the element number of the determined element to be 1.

(Supplementary Note 3)

The terminal according to Supplementary note 1 or 2, wherein when the element of the flag corresponding to the element being the first one of elements having a value of 1 in the encoded packet after the exclusive OR operation is set to be 1, the calculation means discards the encoded packet after the exclusive OR operation without inserting into the matrix.

(Supplementary Note 4)

The terminal according to any one of Supplementary notes 1 to 3, wherein the calculation means performs, on each row vector of the matrix, a process of replacing the row vector with a result of exclusive OR operation between the row vector and the encoded packet after the exclusive OR operation previously performed when, in the row vector of the matrix, an element of same element number as that of the element being the first one of elements having a value of 1 in the encoded packet after the exclusive OR operation previously performed has a value of 1.

(Supplementary Note 5)

The terminal according to any one of Supplementary notes 1 to 4, further comprising a determination means for, when every element of the flag is set to be 1, determining that decoding is completed.

(Supplementary Note 6)

A packet decoding method comprising:

a step in which a computer holds a matrix of n number of rows by n number of columns and an n-bit flag in a storage means;

a step for extracting corresponding elements in a received n-bit encoded packet and in the flag both having a value of 1;

a step for performing, with respect to each element number of the corresponding elements thus extracted, exclusive OR operation between a row vector of the matrix corresponding to the element number and the received encoded packet;

a step for determining an element that is a first one of elements having a value of 1 in the encoded packet after the exclusive OR operation; and a step for inserting the encoded packet after the exclusive OR operation into the matrix as a row vector corresponding to the element number of the element thus determined.

(Supplementary Note 7)

The packet decoding method according to Supplementary note 6, further comprising, a step for that an element number of the element to be 1 by the computer which the element number is corresponded to the element number of the determined element among elements of the flag.

(Supplementary Note 8)

The packet decoding method according to Supplementary note 6 or 7, further comprising, a step for discarding an encoded packet after the exclusive OR operation without being inserted into the matrix by the computer, when the element of the flag corresponding to the element being the first one of elements having a value of 1 in the encoded packet after the exclusive OR operation is set to be 1.

(Supplementary Note 9)

The packet decoding method according to any one of Supplementary notes 6 to 8, further comprising, a step for performing a process of replacing the row vector with a result of exclusive OR operation between the row vector and the encoded packet after the exclusive OR operation previously performed when, in the row vector of the matrix, an element of same element number as that of the element being the first one of elements having a value of 1 in the encoded packet after the exclusive OR operation previously performed has a value of 1, on each row vector of the matrix by the computer.

(Supplementary Note 10)

The terminal according to any one of Supplementary notes 6 to 9, further comprising, a step for determining that decoding is completed when every element of the flag is set to be 1.

(Supplementary Note 11)

A program for causing a computer to execute:

a process of holding a matrix of n number of rows by n number of columns and an n-bit flag in a storage means;

a process of extracting corresponding elements in a received n-bit encoded packet and in the flag both having a value of 1;

a process of performing, with respect to each element number of the corresponding elements thus extracted, exclusive OR operation between a row vector of the matrix corresponding to the element number and the received encoded packet;

a process of determining an element that is a first one of elements having a value of 1 in the encoded packet after the exclusive OR operation; and a process of inserting the encoded packet after the exclusive OR operation into the matrix as a row vector corresponding to an element number of the element thus determined.

(Supplementary Note 12)

The program, according to Supplementary note 11, for causing a computer to execute:

a process for that an element number of the element to be 1 which the element number is corresponded to the element number of the determined element among elements of the flag.

(Supplementary Note 13)

The program, according to Supplementary note 11 or 12, for causing a computer to execute:

a process for discarding an encoded packet after the exclusive OR operation without being inserted into the matrix by the computer, when the element of the flag corresponding to the element being the first one of elements having a value of 1 in the encoded packet after the exclusive OR operation is set to be 1.

(Supplementary Note 14)

The program, according to any one of Supplementary notes 11 to 13, for causing a computer to execute:

a process for performing a process of replacing the row vector with a result of exclusive OR operation between the row vector and the encoded packet after the exclusive OR operation previously performed when, in the row vector of the matrix, an element of same element number as that of the element being the first one of elements having a value of 1 in the encoded packet after the exclusive OR operation previously performed has a value of 1, on each row vector of the matrix by the computer.

(Supplementary Note 15)

The program, according to any one of Supplementary notes 11 to 14, for causing a computer to execute:

a process for determining that decoding is completed when every element of the flag is set to be 1.

Here, it is assumed that the whole disclosures of the patent and no-patent literature mentioned before are incorporated herein by reference. Changes and adjustments may be made to the above-described exemplary embodiment, within the scope of the whole disclosures (including claims) of the present invention and based on its essential technical concept. Further, within the scope of the whole disclosures of the present invention, a variety of combinations or selections of various ones of the disclosed elements (including every element of every claim, every element of every exemplary embodiment, every element of every drawing and the like) may be made. That is, it should be obvious that the present invention embraces various changes and modifications, to the present invention, which are considered to be possible for those skilled in the art to make according to the whole disclosures including claims and the technical concept of the present invention. In particular, any value range described in the present description should be understood to be a specific description of an optional value or a sub-range included in the corresponding intended range, even when no particular mention is given.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

REFERENCE SIGNS LIST 10 sending terminal
12 source packet sending unit
14 packet encoding unit
16 packet sending unit
20, 21 reception terminal
22 packet reception unit
24, 52 packet decoding unit
26 source packet reception unit
28, 54 packet decoding calculation section
30 network
32 Gaussian elimination part
34, 34-1 to 34-X decoding matrix in calculation process by Gaussian elimination
36, 72 decoding determination section
38 source packets before encoding
40 encoded packets to send
44 received encoded packets
46 source packets after decoding
56 storage means
58, 58-1 to 58-Y decoding matrix in algorithm of exemplary embodiment
62, 62-1 to 62-Y pivot flag in algorithm of exemplary embodiment
64 calculation means
66 decoding calculation part
68 pivot position determination part

The invention claimed is:

1. A packet decoding device which is configured to decode a group of source packets including a predetermined number (N) of source packets as a unit from a plurality of encoded packets, received from a sending end, which are encoded based on a rateless coding scheme, wherein each encoded packet is generated by performing an exclusive OR operation on randomly selected source packets from among the group of source packets, and wherein an N-bit flag, each bit number corresponding to a source packet number, for indicating source packets used for encoding, is added, the device comprising:

a processor; and a memory storing a decoding matrix as a working area for decoding processing, and instructions to be executed by the processor, wherein the decoding matrix includes N rows, each row storing one of row vectors being processed and having an N-bit flag portion, each bit number corresponding to a remaining source packet number contained as a result of processing, and each row number corresponding to each source packet number of the group of source packets, wherein the instructions, if executed by the processor, cause the processor to execute:

a decoding calculation part which is configured to repeatedly perform, until a completion of decoding of a predetermined number (N) of source packets is determined, a first exclusive OR operation and a second exclusive OR operation for every just-received encoded packet, wherein the first exclusive OR operation is performed between a just-received encoded packet and a first target row vector found in a row position, corresponding to the source packet number indicated in the N-bit flag of the just-received encoded packet, of the decoding matrix, and a result of the first exclusive OR operation is stored as a first result row vector in a pivot position of the decoding matrix which is a row number corresponding to a most significant bit number indicated in the N-bit flag portion of the first result row vector, and wherein the second exclusive OR operation is performed between the first result row vector just stored by the first exclusive OR operation and a second target row vector so far stored in the decoding matrix which has a value of "1" set to the same bit position of the N-bit flag portion as the most significant bit number of the first result row vector, and the second target row vector is replaced with a result of the second exclusive OR operation as a second result row vector, a decoding determination section which is configured to determine the completion of decoding of the predetermined number (N) of source packets if all N rows of the decoding matrix are filled with row vectors only having a value of "1" set to the bit position of the N-bit flag portion corresponding to the row number.

2. The packet decoding device according to claim 1,
wherein the memory further stores a pivot flag which consists of N-number of bits, each bit number corresponding to a row number of the decoding matrix, and indicates a storing condition of each of rows of the decoding matrix whether the row vector is stored or not, wherein the decoding calculation part compares the pivot flag with the N-bit flag of the just-received encoded packet finds a bit position which is set to "1" in both of the N-bit flag of the just-received encoded packet and the pivot flag, and determines the row vector stored in the row position of the decoding matrix corresponding to the found bit position of the pivot flag as the first target row vector, and wherein, if the first target row vector is not determined, the decoding calculation part stores the just-received packet as it is the pivot position of the decoding matrix as the first result row vector.

3. The packet decoding device according to claim 2,
wherein the decoding calculation part discards the first result row vector without storing into the determined row of the decoding matrix if a value of "1" is already set to the bit in the pivot flag corresponding to the determined row.

4. A packet decoding method for decoding a group of source packets including a predetermined number (N) of source packets as a unit from a plurality of encoded packets, received from a sending end, which are encoded based on a rateless coding scheme, wherein each encoded packet is generated by performing an exclusive OR operation on randomly selected source packets from among the group of source packets, and wherein an N-bit flag, each bit number corresponding to a source packet number, for indicating source packets used for encoding is added, the method comprising:

performing a first exclusive OR operation and a second exclusive OR operation repeatedly, until a completion of decoding of a predetermined number (N) of source packets is determined, for every just-received encoded packet by using a decoding matrix as a working area that includes N rows, each row storing one of row vectors being processed and having an N-bit flag portion, each bit number corresponding to a remaining source packet number contained as a result of processing, and each row number corresponding to each source packet number of the group of source packets, wherein the first exclusive OR operation is performed between a just-received encoded packet and a first target row vector found in a row position, corresponding to the source packet number indicated in the N-bit flak, of the just-received encoded packet, of the decoding matrix, wherein the method further comprises storing a result of the first exclusive OR operation as a first result row vector in a pivot position of the decoding matrix which is a row number corresponding to a most significant bit number indicated in the N-bit flag portion of the first result row vector, wherein the second exclusive OR operation is performed between the first result row vector just stored by the first exclusive OR operation and a second target row vector so far stored in the decoding matrix which has a value of "1" set to the same bit position of the N-bit flag portion as the most significant bit number of the first result row vector, wherein the method further comprises replacing the second target row vector with a result of the second exclusive OR operation as a second result row vector, and wherein the method further comprises determining the completion of decoding of the predetermined number (N) of source packets if all N rows of the decoding matrix are filled with row vectors only having a value of "1" set to the bit position of the N-bit flag portion corresponding to the row number.

5. The packet decoding method according to claim 4,
wherein the first exclusive OR operation includes:
comparing the N-bit flag of the just-received encoded packet with a pivot flag which consists of N-number of bits, each bit number corresponding to a row number of the decoding matrix, and indicates a storing condition of each of rows of the decoding matrix whether the row vector is stored or not;

finding a bit position which is set to "1" in both of the N-bit flag of the just-received encoded packet and the pivot flag;

determining the row vector stored in the row position of the decoding matrix corresponding to the found bit position of the pivot flag as the first target row vector; and storing, if the first target row vector is not determined, the just-received packet as it is in the pivot position of the decoding matrix as the first result row vector.

6. The packet decoding method according to claim 5, wherein the first exclusive OR operation further comprises discarding the first result row vector without storing into the determined row of the decoding matrix if a value of "1" is already set to the bit in the pivot flag corresponding to the determined row.

7. A non-transitory computer-readable recording medium having embodied thereon a computer program, which if executed by a computer, causes the computer to execute a process of a packet decoding device for decoding a group of source packets including a predetermined number (N) of source packets as a unit from a plurality of encoded packets, received from a sending end, which are encoded based on a rateless coding scheme, wherein each encoded packet is generated by performing an exclusive OR operation on randomly selected source packets from among the group of source packets, and an N-bit flag, each bit number corresponding to a source packet number, for indicating source packets used for encoding is added, said process comprising:

performing a first exclusive OR operation and a second exclusive OR operation repeatedly, until a completion of decoding of a predetermined number (N) of source packets is determined, for every just-received encoded packet by using a decoding matrix as a working area that includes N rows, each row storing one of row vectors being processed and having an N-bit flag portion, each bit number corresponding to a remaining source packet number contained as a result of processing, and each row number corresponding to each source packet number of the group of source packets, wherein the first exclusive OR operation is performed between a just-received encoded packet and a first target row vector found in a row position, corresponding to the source packet number indicated in the N-bit flag of the just-received encoded packet, of the decoding matrix, wherein the process further comprises storing a result of the first exclusive OR operation as a first result row vector in a pivot position of the decoding matrix which is a row number corresponding to a most significant bit number indicated in the N-bit flag portion of the first result row vector, wherein the second exclusive OR operation is performed between the first result row vector just stored by the first exclusive OR operation and a second target row vector so far stored in the decoding matrix which has a value of "1" set to the same bit position of the N-bit flag portion as the most significant bit number of the first result row vector, wherein the process further comprises replacing the second target row vector with a result of the second exclusive OR operation as a second result row vector, and wherein the process further comprises determining the completion of decoding of the predetermined number (N) of source packets if all N rows of the decoding matrix are filled with row vectors only having a value of "1" set to the bit position of the N-bit flag portion corresponding to the row number.

\* \* \* \* \*

UNITED STATES PATENT AND TRADEMARK OFFICE
CERTIFICATE OF CORRECTION

PATENT NO. : 10,404,288 B2
APPLICATION NO. : 15/312808
DATED : September 3, 2019
INVENTOR(S) : Yuki Hayashi, Jun Suzuki and Masaki Kan It is certified that error appears in the above-identified patent and that said Letters Patent is hereby corrected as shown below:

In the Specification

Column 14, Reference Signs Lists, Line 41; Delete "40" and insert --42-- therefor In the Claims Column 15, Line 52; In Claim 2, after "packet", insert --,--

Column 16, Line 28; In Claim 4, delete "flak," and insert --flag-- therefor

Signed and Sealed this
Twenty-eighth Day of January, 2020

Andrei Iancu
*Director of the United States Patent and Trademark Office*